United States Patent
Lee et al.

(10) Patent No.: US 6,982,917 B2
(45) Date of Patent: Jan. 3, 2006

(54) DRAM PARTIAL REFRESH CIRCUITS AND METHODS

(75) Inventors: Yun-sang Lee, Kyungki-do (KR); Won-chang Jung, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 295 days.

(21) Appl. No.: 10/192,406

(22) Filed: Jul. 10, 2002

(65) Prior Publication Data

US 2003/0086325 A1 May 8, 2003

(30) Foreign Application Priority Data

Nov. 6, 2001 (KR) ........................................ 2001-68841

Publication Classification

(51) Int. Cl.
*G11C 7/00* (2006.01)

(52) U.S. Cl. .............. 365/222; 365/230.03; 365/230.06
(58) Field of Classification Search ................. 365/222, 365/203, 194, 230.03, 230.06
See application file for complete search history.

(56) References Cited

U.S. PATENT DOCUMENTS 5,835,436 A * 11/1998 Ooishi ................... 365/230.03
6,449,204 B1 * 9/2002 Arimoto et al. ............ 365/222
6,590,822 B2 * 7/2003 Hwang et al. ............... 365/222

FOREIGN PATENT DOCUMENTS

KR     1020000009468     2/2000
KR     1002696180000     7/2000

OTHER PUBLICATIONS

Notice to Submit Response—issued by Korean Patent Office, Aug. 29, 2003.

* cited by examiner

*Primary Examiner*—Gene Auduong
(74) *Attorney, Agent, or Firm*—Myers Bigel Sibley & Sajovec

(57) ABSTRACT

Circuits and methods for refreshing memory banks in a DRAM are provided. A refresh circuit is provided in a DRAM having at least one memory bank and a plurality of word lines connected to memory locations in the memory bank. The word lines are subdivided into first and second groups of subword lines. The refresh circuit includes a delay circuit, a first driving circuit, and a second driving circuit. The delay circuit receives a refresh signal and outputs a delayed refresh signal a predetermined time delay later. The first driving circuit responds to the refresh signal by driving word lines in the first group of subword lines and the second driving circuit responds to the delayed refresh signal by driving word lines in the second group of subword lines.

9 Claims, 3 Drawing Sheets

DRAM PARTIAL REFRESH CIRCUITS AND METHODS

RELATED APPLICATION

This application claims priority from Korean Application No. 2001-68841, filed Nov. 6, 2001, the disclosure of which is hereby incorporated herein by reference.

FIELD OF THE INVENTION

The present invention relates to dynamic random access memory (hereinafter, referred to as "DRAM") devices and more particularly to circuits and methods for refreshing DRAM devices.

BACKGROUND OF THE INVENTION

A memory cell in a DRAM generally includes transistor and capacitors in which data is stored. Since capacitors can lose charge over time, the DRAM is periodically refreshed to recharge data stored in the memory cells. The refresh operation can involve enabling several world lines (W/L) in an active row of memory cells and sensing the bit lines for the cells. For a synchronous DRAM having 4 memory banks of cell arrays, a refresh operation may involve simultaneously activating 4–8 word lines. In contrast, during a read/write operation in the 4 memory banks, only 1–2 word lines may be activated at a time. Consequently, the amount of power drawn by, and the noise introduced into, the memory banks during a refresh operation can be substantially higher than during a read/write operation. As a result, the refresh operation itself can cause a loss of data and can lead to deterioration of the memory cells of the DRAM.

One approach to reducing the noise introduced during a refresh operation is to provide a partial refresh operation in which word lines for the memory banks are sequentially activated at time intervals of $\Delta t$ and the bit lines for the memory banks are also sequentially sensed at time intervals of $\Delta t$.

An example of a partial refresh operation is provided with respect to FIG. 1. The DRAM shown in FIG. 1 includes 4 memory banks A, B, C, and D. During a refresh operation, word lines W/L_A, W/L_B, W/L_C, and W/L_D, which correspond to row addresses (or "X address"), in the memory banks A, B, C, and D are sequentially activated at time intervals of $\Delta t$. Time delay is introduced between the word lines W/L_A, W/L_B, W/L_C, and W/L_D by delay devices D1, D2, D3, and D4. In this manner, the peak noise occurring during a refresh operation may be reduced by about ¼ relative to a refresh operation in which the four word lines are simultaneously activated.

Further reduction of the peak noise during a refresh operation is desirable to improve the operational characteristics of DRAMs.

SUMMARY OF THE INVENTION

According to some embodiments of the present invention, a refresh circuit is provided in a DRAM having at least one memory bank and a plurality of word lines connected to memory locations in the memory bank. The word lines are subdivided into first and second groups of subword lines. The refresh circuit can include a delay circuit, a first driving circuit, and a second driving circuit. The delay circuit receives a refresh signal and outputs a delayed refresh signal a predetermined time delay later. The first driving circuit responds to the refresh signal by driving word lines in the first group of subword lines and the second driving circuit responds to the delayed refresh signal by driving word lines in the second group of subword lines.

The delay circuit can further include a data sensing controller which senses signals on the subword lines indicative of data stored in memory locations within the memory bank, and which correspond to the refresh signal, for a predetermined sensing time duration. The delay circuit can delay the output of the delayed refresh signal for a time delay which is at least as long as the predetermined sensing time duration. The time delay introduced by the delay circuit can be at least as long as the time duration for the signals which are sensed by the data sensing controller on the subword lines to substantially stabilize. The data sensing controller can sense signals on the first group of subword lines in response to the refresh signal and sense signals on the second group of subword lines in response to the delayed refresh signal. The data sensing controller can include first and second sensing controllers connected to the first and second groups of subword lines, respectively.

According to other embodiments of the present invention a refresh method is provided in a DRAM having at least one memory bank, a plurality of word lines, and a plurality of bit lines connected between each of the word lines and memory locations within the memory bank. The word lines can be subdivided into at least first and second groups of subword lines. A refresh signal can be provided to the first group of subword lines and can be provided to the second group of subword lines a predetermined time delay $\Delta t$ after the refresh signal is provided to the first group of subword lines.

The refresh method can further include sensing signals on the bit lines connected to the first group of subword lines, and which correspond to the refresh signal, for a first predetermined sensing time duration. Signals on the bit lines connected to the second group of subword lines, and which correspond to the refresh signal, can be sensed for a second predetermined sensing time duration. The predetermined time delay can be at least as long as the first predetermined sensing time duration or can be as long as the time needed for signals on the bit lines to substantially stabilize when sensing signals on the bit lines connected to the first group of subword lines.

In this manner, partial refresh circuits and methods are provided in which noise during a refresh operation in a DRAM may be reduced and the reliability of the DRAM may be improved.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
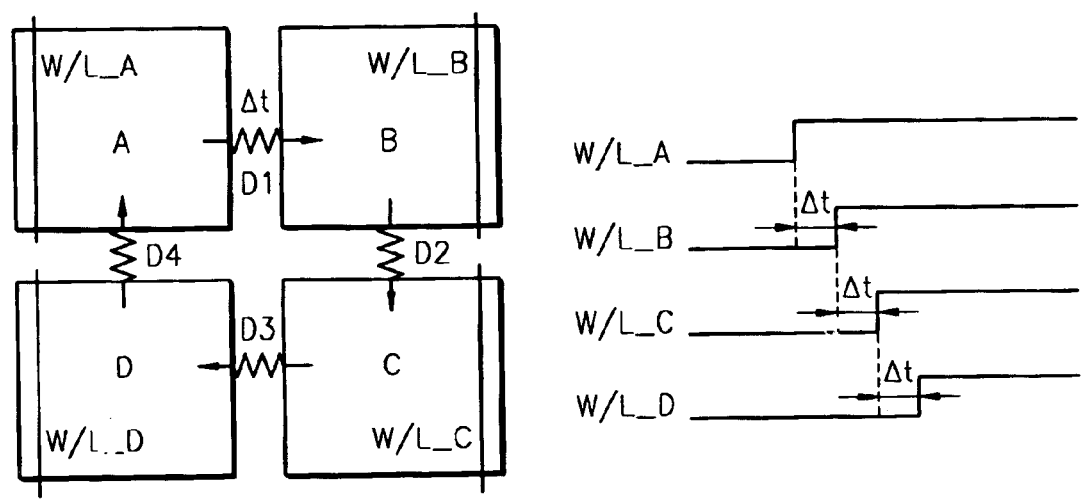
FIG. 1 is a block diagram of four memory banks and a conventional refresh circuit of a DRAM and timing diagrams of the same.

The following description of an embodiment is provided for a person of ordinary skill in the art to fully understand the present invention. Many changes to the following embodiment are possible, and thus, the present invention is not restricted to this embodiment. Terms used herein are to be given their ordinary meaning unless explicitly defined otherwise herein. Like reference numerals in the drawings denote the same members.

Figure 2:
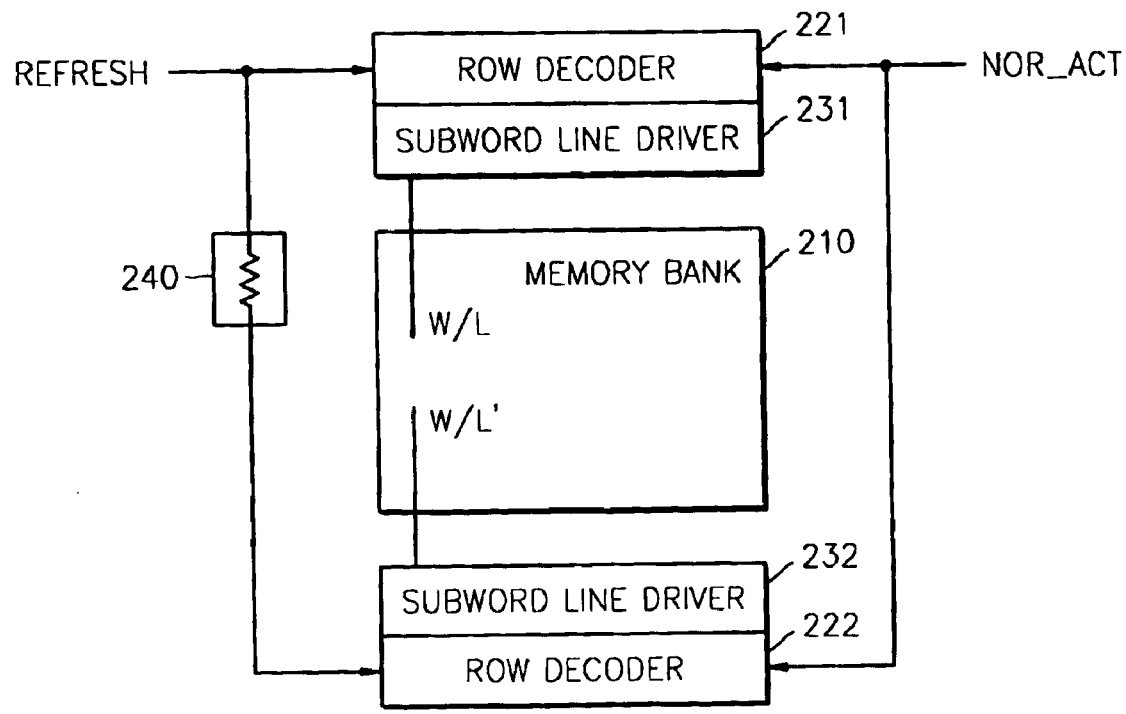
FIG. 2 is a block diagram of memory banks and partial refresh circuitry of a DRAM according to some embodiments of the present invention and timing diagrams of the same.
Figure 2:
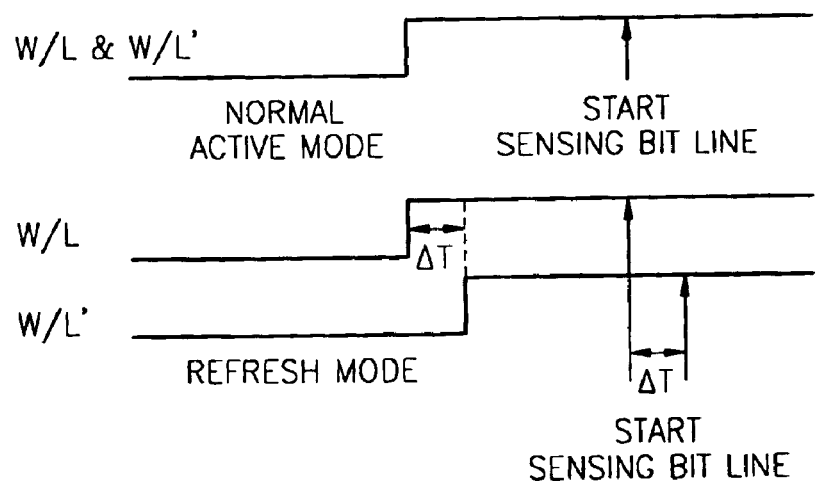

With reference to FIG. 2, a DRAM device and refresh circuit according to some embodiments of the present invention are shown. The DRAM device can include a memory bank 210, two subword line drivers 231 and 232, and two row decoders 221 and 222. The row decoders 221 and 222 decode row addresses (or X addresses) and select one of the word lines in the memory bank 210. The subword line drivers 231 and 232 provide a high voltage signal on a selected word line. Each of the word lines can be divided into two subword lines W/L and W/L' that are driven by the subword line drivers 231 and 232, respectively.

During read/write access (also referred to as "normal active mode") a normal active signal NOR_ACT can be simultaneously input to the row decoders 221 and 222. Accordingly, the first and second subword lines W/L and W/L' can be activated at the same time and the bit lines which are within the memory bank 210 and connected to the activated subword lines W/L and W/L' can be sensed at the same time.

During a refresh mode, a refresh signal REFRESH, which identifies a row address, can be provided to the row decoder 221 and to a delay circuit 240, which introduces a delay in the REFRESH signal, and can be subsequently provided to the row decoder 222. Accordingly, the subword lines W/L and W/L' selected by the REFRESH signal can be sequentially activated at predetermined time intervals of $\Delta t$ and the bit lines connected thereto can be sequentially sensed at the predetermined $\Delta t$ time intervals. In this manner, the noise introduced by the REFRESH operation can be reduced.

Figure 3:
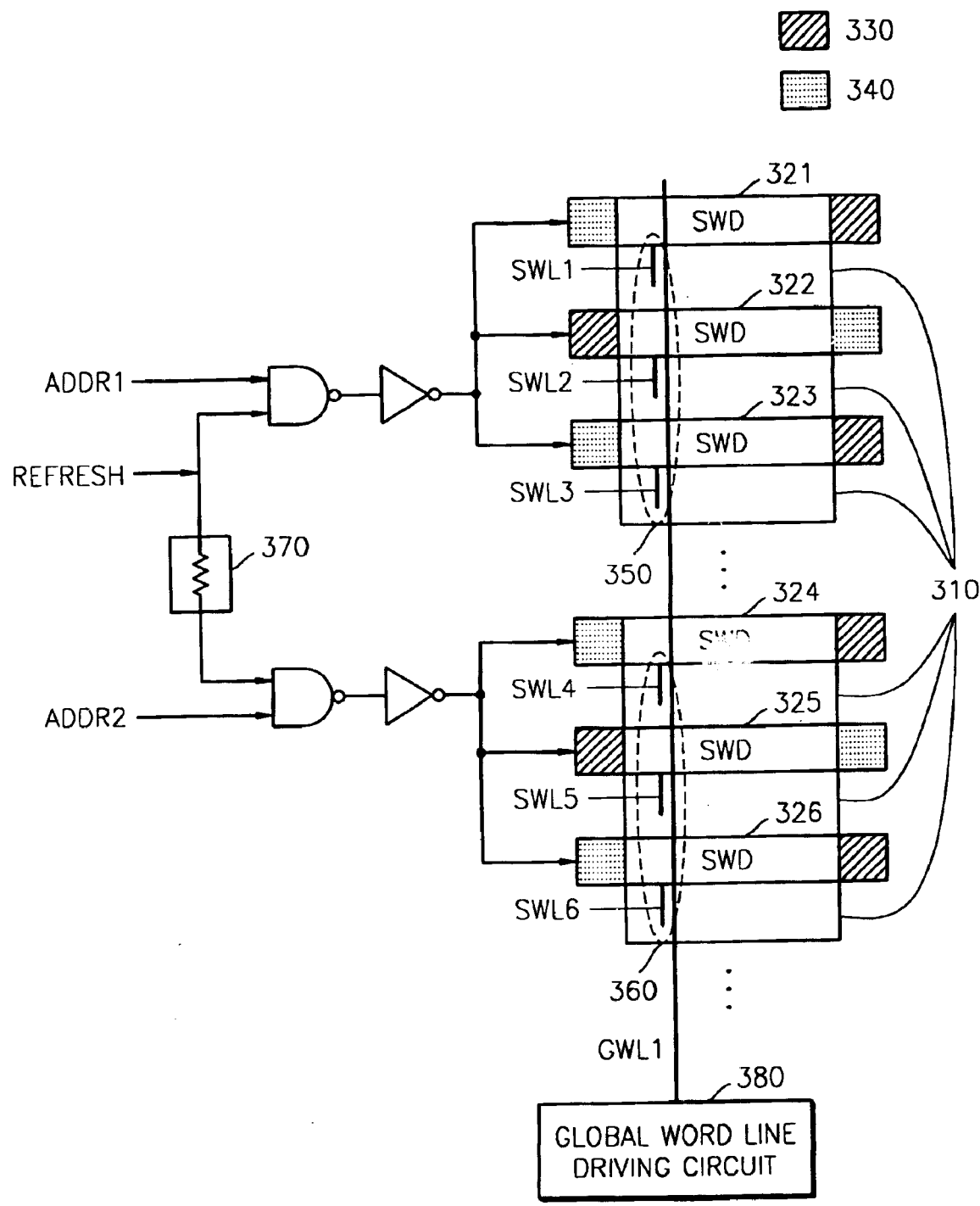
FIG. 3 is a block diagram of memory banks and partial refresh circuitry of a DRAM according to other embodiments of the present invention.

FIG. 3 is a block diagram of a DRAM having a partial refresh circuit according to some other embodiments of the present invention. According to these embodiments, a row address selects a row of word lines and portions of the selected word lines are sequentially activated. The DRAM device can include a memory bank 310, a plurality of subword line drivers 321 through 326, a delay circuit 370, and a global word line driving circuit 380. The DRAM device can further include word line controllers 330, which control the subword line drivers 321 through 326, and sense amplifier controllers 340, which control bit line sense amplifiers (not shown).

The memory bank 310 can include a plurality of global word lines and subword lines that are respectively controlled by the global word lines. For descriptive convenience, six subword lines SWL1 through SWL6 controlled by one global word line GWL1 are shown in FIG. 3. First through third subword lines SWL1 through SWL3 belong to a first subword line group 350, and fourth through sixth subword lines SWL4 through SWL6 belong to a second subword line group 360.

When the DRAM device is in a refresh mode, a refresh mode signal REFRESH is activated. A NAND operation is performed on the REFRESH signal and a first column address ADDR1, and the result is inverted and provided to the word line controllers 330 and the sense amplifier controllers 340 in the subword line group 350. The REFRESH signal is delayed by a predetermined time of $\Delta t$ by a delay circuit 370. A NAND operation can then be performed on the delayed REFRESH signal output from the delay circuit 370 and a second column address ADDR2, and the result of the NAND operation can be inverted and provided to the word line controllers 330 and the sense amplifier controllers 340 in the subword line group 360. The word line controllers 330 control the subword line drivers 321 through 326, and the sense amplifier controllers 340 control bit line sense amplifiers.

In a normal active mode, the first column address can selectively activate subword line group 350 while the second column address can selectively activate subword line group 360.

In the refresh mode, the first and second column addresses ADDR1 and ADDR2 are both high level '1'. Thus, the subword lines SWL1 through SWL6 in the first and second subword line groups 350 and 360 are all driven. However, the subword lines SWL1 through SWL3 in the first subword line group 350 can be driven with less delay and sensed by a bit line sense amplifier, and the subword lines SWL4 through SWL6 in the second subword line group 360 can be driven and sensed after a delay interval of $\Delta t$.

In this manner, partial refresh circuits and methods are provided in which noise during a refresh operation in a DRAM can be reduced and the reliability of the DRAM can be improved.

It will be understood by one of ordinary skill in the art that modifications of these embodiments may be made without departing from the spirit and scope of the invention. For example, in FIG. 3, while two subword line groups are shown as activated at each time interval the number of subword line groups which are activated and the number of delay devices may vary. It will further be understood that the refresh circuit disclosed herein can be applied to a DRAM having more than one bank of memory. All such variations and modifications are intended to be included herein within the scope of the present invention, as set forth in the following claims.

What is claimed is:

1. A refresh method in a DRAM including at least one memory bank having a plurality of word lines and a plurality of bit lines connected to each of the word lines, the refresh method comprising:

subdividing the word lines into at least first and second groups of subword lines, wherein the first and second groups of subword lines both correspond to a same predetermined row address in the memory bank;

providing a refresh signal to the first group of subword lines; and providing the refresh signal to the second group of subword lines a predetermined time delay $\Delta t$ after the refresh signal is provided to the first group of subword lines.

2. The refresh method of claim 1, further comprising the steps of:

first sensing signals on the bit lines connected to the first group of subword lines, and which correspond to the refresh signal, for a first predetermined sensing time duration; and second sensing signals on the bit lines connected to the second group of subword lines for a second predetermined sensing time duration.

3. The refresh method of claim 1, wherein:

the step of second sensing signals is performed a predetermined time delay $\Delta t$ after the step of first sensing signals.

4. A refresh circuit in a DRAM having at least one memory bank and a plurality of word lines connected to memory locations in the memory bank, the word lines subdivided into first and second groups of subword lines, the refresh circuit comprising:

a delay circuit which receives a refresh signal and outputs a delayed refresh signal a predetermined time delay later;

a first driving circuit which responds to the refresh signal by driving word lines in the first group of subword lines; and a second driving circuit which responds to the delayed refresh signal by driving word lines in the second group of subword lines, wherein the first and second groups of subword lines both correspond to a same predetermined row address in the memory bank.

5. The refresh circuit of claim 4, further comprising:

a data sensing controller which senses signals on the subword lines indicative of data stored in memory locations within the memory bank for a predetermined sensing time duration.

6. The refresh circuit of claim 5, wherein:

the data sensing controller senses signals on the first group of subword lines in response to the refresh signal; and the data sensing controller senses signals on the second group of subword lines in response to the delayed refresh signal.

7. The refresh circuit of claim 6, wherein the data sensing controller comprises:

a first sensing circuit connected to sense signals on the first group of subword lines; and a second sensing circuit connected to sense signals on the second group of subword lines.

8. A refresh circuit in a DRAM having at least one memory bank, a plurality of global word lines, and at least first and second groups of subword lines connected to each of the global word lines, the refresh circuit comprising:

a driving circuit which responds to a refresh signal and activates one of the global word lines corresponding to a predetermined row address;

a first subword line decoder which responds to the refresh signal to activate the first group of subword lines which correspond to the same predetermined row address; and a second subword line decoder which responds to the refresh signal, after a predetermined time delay, to activate the second group of subword lines which correspond to the same predetermined row address.

9. The refresh circuit of claim 8, further comprising:

a data sensing controller which senses signals indicative of data stored in memory locations within the memory bank, for a predetermined sensing time duration.

* * * * *